(12) United States Patent
Chang et al.

(10) Patent No.: US 7,504,764 B2
(45) Date of Patent: Mar. 17, 2009

(54) ELECTRIC POWER GENERATING APPARATUS FOR MOVEMENT TYPE EQUIPMENT AND SELF-GENERATION SYSTEM HAVING THE SAME

(75) Inventors: Young-Soo Chang, Seoul (KR); Heon-Ju Lee, Gyeonggi-Do (KR); Yoon-Pyo Lee, Seoul (KR)

(73) Assignee: Korea Institute of Science and Technology

( * ) Notice: Subject to any disclaimer, the term of this patent is extended or adjusted under 35 U.S.C. 154(b) by 47 days.

(21) Appl. No.: 11/616,654

(22) Filed: Dec. 27, 2006

(65) Prior Publication Data

US 2008/0100182 A1     May 1, 2008

(30) Foreign Application Priority Data

Nov. 1, 2006    (KR) .................... 10-2006-0107440

(51) Int. Cl.
    *H01L 41/113*    (2006.01)
(52) U.S. Cl. ........................ 310/339; 310/329
(58) Field of Classification Search ............... 310/327, 310/329, 338, 339
   See application file for complete search history.

(56) References Cited

U.S. PATENT DOCUMENTS

| | | | | |
|---|---|---|---|---|
| 3,456,134 | A * | 7/1969 | Ko ................................ | 607/35 |
| 4,307,602 | A * | 12/1981 | Sawada et al. .............. | 73/35.11 |
| 4,387,318 | A * | 6/1983 | Kolm et al. .................. | 310/330 |
| 5,539,270 | A * | 7/1996 | Kaji et al. .................... | 310/329 |
| 5,703,295 | A * | 12/1997 | Ishida et al. .................. | 73/593 |
| 5,751,091 | A * | 5/1998 | Takahashi et al. ........... | 310/339 |
| 5,801,475 | A * | 9/1998 | Kimura ....................... | 310/319 |
| 6,252,336 | B1 * | 6/2001 | Hall ............................ | 310/339 |
| 6,407,484 | B1 * | 6/2002 | Oliver et al. ................. | 310/339 |
| 6,433,465 | B1 | 8/2002 | McKnight et al. | |
| 6,725,713 | B2 * | 4/2004 | Adamson et al. ........... | 73/146.5 |

(Continued)

FOREIGN PATENT DOCUMENTS

JP        07-245970    *   9/1995

(Continued)

*Primary Examiner*—Thomas M Dougherty
(74) *Attorney, Agent, or Firm*—Ostrolenk Faber Gerb & Soffen, LLP (57) ABSTRACT

Provided are an electric power generating apparatus for a movement type equipment and a self-generation system having the same. The electric power generating apparatus for a movement type equipment includes: a piezoelectric beam having an end fixed to a movement type equipment and other end with a mass; and a rectifier unit for rectifying and storing electric energy generated due to deformation of the piezoelectric beam. The self-generation system includes: a movement type equipment; and an electric power generating apparatus for a movement type equipment including a piezoelectric beam having an end fixed to a movement type equipment and other end with a mass, and a rectifier unit for rectifying and storing electric energy generated due to deformation of the piezoelectric beam. According to the electric power generating apparatus for the movement type equipment and the self-generation system having the same, since external movement is converted into vibration perpendicular to an electric beam using elasticity of the electric beam and load applied to an end of the beam, continuous vibration is induced to the piezoelectric beam. Also, high energy conversion efficiency can be obtained by using resonance.

9 Claims, 7 Drawing Sheets

U.S. PATENT DOCUMENTS

| | | | |
|---|---|---|---|
| 6,858,970 B2 * | 2/2005 | Malkin et al. | 310/322 |
| 6,938,311 B2 * | 9/2005 | Tanielian | 29/25.35 |
| 7,081,693 B2 | 7/2006 | Hamel et al. | |
| 7,132,757 B2 * | 11/2006 | Steigerwald et al. | 290/1 R |
| 2003/0160543 A1 | 8/2003 | Lee et al. | |
| 2004/0075367 A1 * | 4/2004 | Rado | 310/339 |
| 2006/0006991 A1 * | 1/2006 | Tyndall et al. | 340/442 |
| 2007/0114890 A1 * | 5/2007 | Churchill et al. | 310/339 |
| 2007/0145861 A1 * | 6/2007 | Tanner | 310/339 |

FOREIGN PATENT DOCUMENTS

| | | | |
|---|---|---|---|
| JP | 2000-214037 | | 8/2002 |
| KR | 2002-0059284 | | 7/2002 |
| KR | 2005-0003595 | | 1/2005 |
| WO | WO-90/15973 | * | 12/1990 |
| WO | WO/2006/046989 | * | 7/2005 |
| WO | WO/2006/102437 | * | 9/2006 |
| WO | WO/2007/063271 | * | 11/2006 |
| WO | WO/2007/071975 | * | 6/2007 |

* cited by examiner

ELECTRIC POWER GENERATING APPARATUS FOR MOVEMENT TYPE EQUIPMENT AND SELF-GENERATION SYSTEM HAVING THE SAME

RELATED APPLICATION

The present disclosure relates to subject matter contained in priority Korean Application No. 10-2006-0107440, filed on Nov. 1, 2006, which is herein expressly incorporated by reference in its entirety.

BACKGROUND OF THE INVENTION

1. Field of the Invention

The present invention relates to an electric power generating apparatus for a movement type equipment and a self-generation system having the same, and more particularly, to an electric power generating apparatus for a movement type equipment capable of generating electric power using vibration, periodical movement, and rotation of a movement type equipment without supply of a battery or external energy and a self-generation system having the same.

2. Description of the Background Art

Mobility of all electronic equipments will be generalized in future life. Therefore, various types of mobile power source will be developed and commonly used. In a power source of a wireless sensor, an intelligent radio frequency identification (RFID) system, and a standalone sensor, of which demand is expected to rapidly increase in a ubiquitous environment, a research has been conducted into ways of using them for long by electrically accumulating and converting a near energy source without injection of fuel or change of a battery. That is, a research has been conducted for an electric power generating apparatus for a movement type equipment that collects energy such as thermal energy and vibration energy, converts the energy into electric energy and stores them.

A generating method using a piezoelectric material has been widely used for such an electric power generating apparatus for a movement type in order to realize a simplified structure and a small size. The piezoelectric material may be defined as a material capable of mutually converting applied mechanical energy and electric energy. A piezoelectric material such as PZT and PVDF generates a voltage from applied pressure and when an electric field is applied thereto, mechanical deformation occurs. Such a piezoelectric material can convert mechanical vibration energy into electric energy, and electric energy into mechanical vibration energy, and has very high conversion efficiency. Function of the piezoelectric material is divided into a sensor and an actuator depending on its energy conversion, and the piezoelectric material is applied to a pressure sensor, a load sensor, an acceleration sensor, an actuator for precise transportation equipment, etc.

The invention, which forms the piezoelectric material in a beam shape and uses a low voltage generated when a piezoelectric beam is deformed due to external force as an energy source, is disclosed in U.S. Publication No. 20030160543 (Microelectromechanical generator using bubbles).

Meanwhile, such an electric power generating apparatus for a movement type equipment generally may be used as a power source of a tire pressure monitoring system (TPMS), e.g., as a power source of a wireless sensor mounted in a tire to measure pressure and temperature and transfer information as a signal.

The TMPS, which is one of various electronic apparatus for safe drive of vehicles, mounts a sensor in a tire to detect a temperature and pressure in the tire, and provides information for safe and economical drive to drivers. However, since electric power for operating a sensor and transferring a signal depends on only batteries, periodical change of battery is required.

In this regard, the technology that obtains electric power used for measuring pressure in a tire from a self-generating apparatus using rotation of the tire is disclosed in Japanese Laid-open Patent Publication No. 2000-214037. This technology obtains electric power from acceleration due to speed change while driving a car to rotate a magnetic rotation plate, and induces electricity from a coil installed around the rotation plate to obtain electric power necessary for driving a sensor.

In Korean Publication No. 2005-0003595 (Kim Seung-lae, et al., "self-generating apparatus for tire") very similar to the above-mentioned invention, a structure is simplified with a method of inducing rotation by using a rotation weight symmetrically instead of a complicated rotation plate.

Also, in Korean Publication No. 2002-0059284 (power generating apparatus using load of car body applied to tire), a plurality of compartments that allows for entrance and exit of fluid are formed in a tire and a rotator is rotated using force applied to the fluid to generate power. However, processing of complicated shape is required in the tire, and energy conversion efficiency is low.

Also, in U.S. Pat. No. 6,433,465 (Energy-harvesting device using electrostrictive polymers), a multilayered piezoelectric polymer layer is used, and a voltage generated in deformation is rectified, stored, and used.

Also, in U.S. Pat. No. 7,081,693 (Energy harvesting for wireless sensor operation and data transmission), an electric circuit structure and data transmission method for a wireless communication was invented. In U.S. Pat. No. 5,801,475 (Piezo-electric generation device), a cantilever structure and a membrane structure rectifying and storing A.C. power source and controlling a generated voltage to stably generate power were invented.

However, in the case of the above-mentioned patents, only when rotation speed of a tire changes, acceleration is generated to operate a device. Also, since centrifugal force is much stronger than gravity in a constant speed movement, force is applied only in a radius direction and the device does not operate.

SUMMARY OF THE INVENTION

Therefore, an object of the present invention is to provide an electric power generating apparatus for a movement type equipment having a high energy conversion efficiency.

Also, an object of the present invention is to provide an electric power generating apparatus for a movement type equipment having a high energy conversion efficiency even when too much load is applied in a direction parallel to a piezoelectric beam or in constant speed rotation.

Also, an object of the present invention is to provide a self-generation system having the above-mentioned electric power generating apparatus for the movement type equipment.

To achieve these and other advantages and in accordance with the purpose of the present invention, as embodied and broadly described herein, there is provided an electric power generating apparatus for a movement type equipment including: a piezoelectric beam having an end fixed to a movement type equipment and other end with a mass; and a rectifier unit for rectifying and storing electric energy generated due to deformation of the piezoelectric beam.

To achieve these and other advantages and in accordance with the purpose of the present invention, as embodied and broadly described herein, there is provided an electric power generating apparatus for a movement type equipment including: a base mounted on a movement type equipment; a piezoelectric beam having an end mounted on the base; a mass unit mounted on other end of the piezoelectric beam; and a rectifier unit for rectifying and storing electric energy generated due to deformation of the piezoelectric beam.

Here, ends of a plurality of piezoelectric beams may be disposed in a row on the base, and the mass part may connect other ends of the piezoelectric beams with one another. Other ends of the piezoelectric beams may be inserted into a plurality of mounting grooves formed in the mass part.

Here, the electric power generating apparatus for the movement type equipment may further include: a guide unit for guiding the mass part to slide in a direction perpendicular to the piezoelectric beams; and a support member for supporting the guide unit.

Here, the electric power generating apparatus for the movement type equipment may further include a stopper for limiting the movement range of the mass part.

To achieve these and other advantages and in accordance with the purpose of the present invention, as embodied and broadly described herein, there is provided a self-generation system including: a movement type equipment; and an electric power generating apparatus for a movement type equipment including a piezoelectric beam having an end fixed to a movement type equipment and other end with a mass, and a rectifier unit for rectifying and storing electric energy generated due to deformation of the piezoelectric beam.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
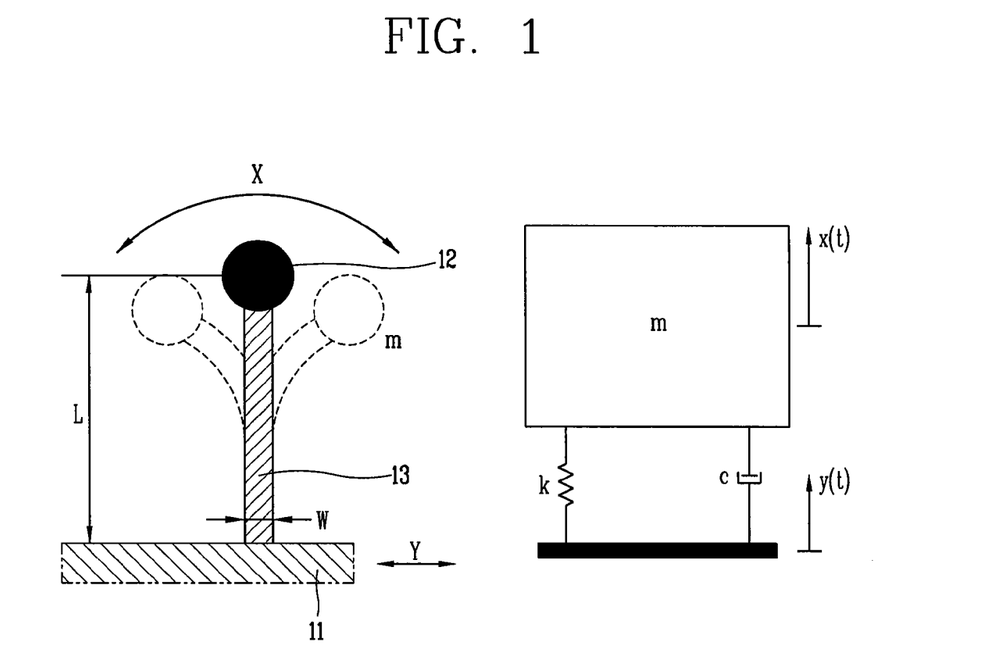
FIG. 1 is a view illustrating a basic structure of an electric power generating apparatus for a movement type equipment and m-c-k modeling thereof according to a first embodiment of the present invention (herein, L=length of a piezoelectric beam, w=width, m=mass, k=spring constant, c=damping coefficient, x=amplitude of a mass part, and y=amplitude of a base)
Figure 2:
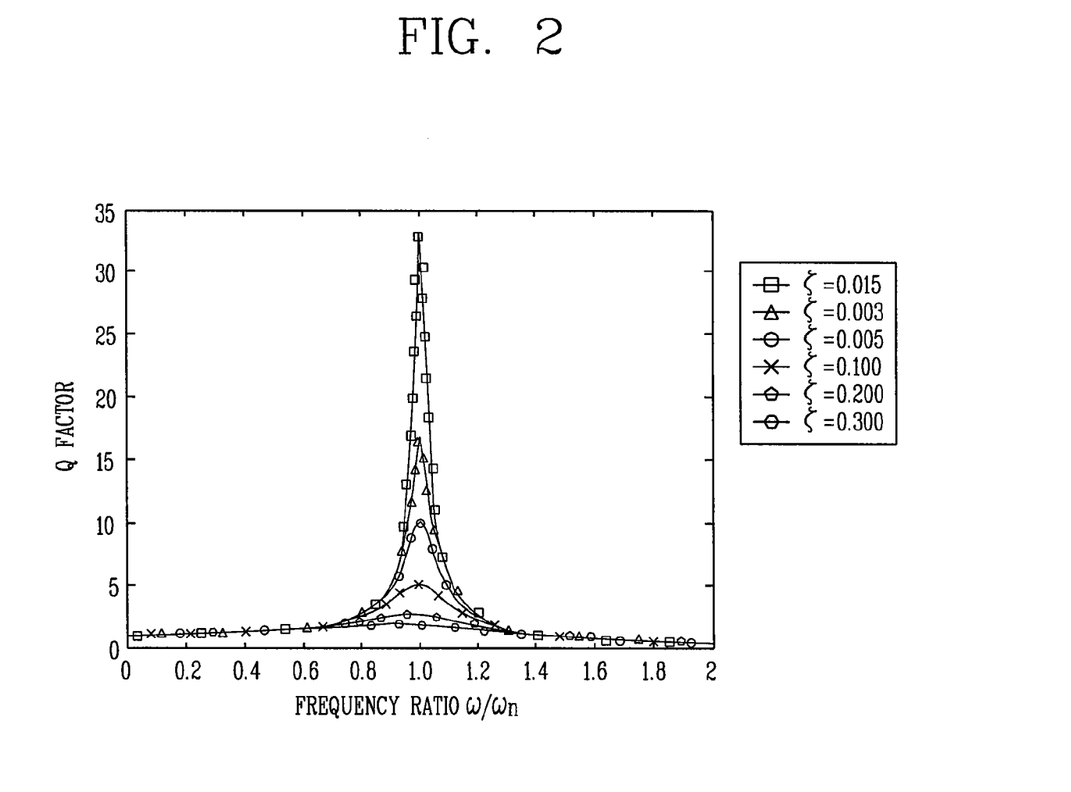
FIG. 2 is a graph illustrating displacement transmissibility (Q) for the m-c-k modeling of FIG. 1 depending on variation of a frequency ratio ($\omega/\omega_n$) and a damping ratio ($\zeta$)

FIG. 1 is a view illustrating a basic structure of an electric power generating apparatus for a movement type equipment and m-c-k modeling thereof according to a first embodiment of the present invention. Herein, L represents a length of a piezoelectric beam, w represents a width, m represents mass, k represents spring constant, c represents damping coefficient, x represents amplitude of a mass part, and y represents amplitude of a base. FIG. 2 is a graph illustrating displacement transmissibility (Q) for the m-c-k modeling of FIG. 1 depending on variation of a frequency ratio ($\omega/\omega_n$) and a damping ratio ($\zeta$).

Referring to FIGS. 1 and 2, an electric power generating apparatus according to a first embodiment of the present invention includes a piezoelectric beam 13 and a rectifier unit (not shown). The piezoelectric beam 13 has one end of the piezoelectric beam 13 fixed to a movement type equipment 11 and other end with a mass 12. The rectifier unit rectifies and stores electric energy generated due to deformation of the piezoelectric beam 13.

A system including the piezoelectric beam 13 having one end fixed to the movement type equipment 11 and other end with the mass 12 may be modeled as a spring-mass-attenuator system, as illustrated in FIG. 1. This is called a base excitation or a support motion. The base excitation is represented by a governing equation such as Equation (1), and displacement of a mass is represented by Equation (2). Here, Y represents an amplitude of a base movement, $\omega_n$ represents a natural vibration frequency, $\omega$ represents a base vibration frequency, and $\zeta$ represents a damping ratio.

$$m\ddot{x}(t)+c[\dot{x}(t)-\dot{y}(t)]+k[x(t)-y(t)]=0 \qquad (1)$$

$$x(t) = \omega_n Y \sqrt{\frac{\omega_n^2 + (2\zeta\omega)^2}{(\omega_n^2 - \omega^2)^2 + (2\zeta\omega_n\omega)^2}} \cos\theta \qquad (2)$$

A displacement transmissibility (Q) may be represented by Equation (3) and represents how much movement from a base is transmitted to a mass. Herein, Y is an amplitude of a base movement, and X is an amplitude of a mass part.

$$Q = \frac{X}{Y} = \sqrt{\frac{1 + \left(2\zeta\frac{\omega}{\omega_n}\right)^2}{\left[1 - \left(\frac{\omega}{\omega_n}\right)^2\right]^2 + \left(2\zeta\frac{\omega}{\omega_n}\right)^2}} \qquad (3)$$

As shown in FIG. 2, a displacement transmissibility more than 30 times may be obtained by properly adjusting shape of the piezoelectric beam or a mass. Therefore, according to the present invention, when any external movement occurs, the shape of the piezoelectric beam or the mass is changed to cause resonance with a natural vibration frequency similar to the movement, thereby obtaining the maximum energy conversion effect.

Figure 3:
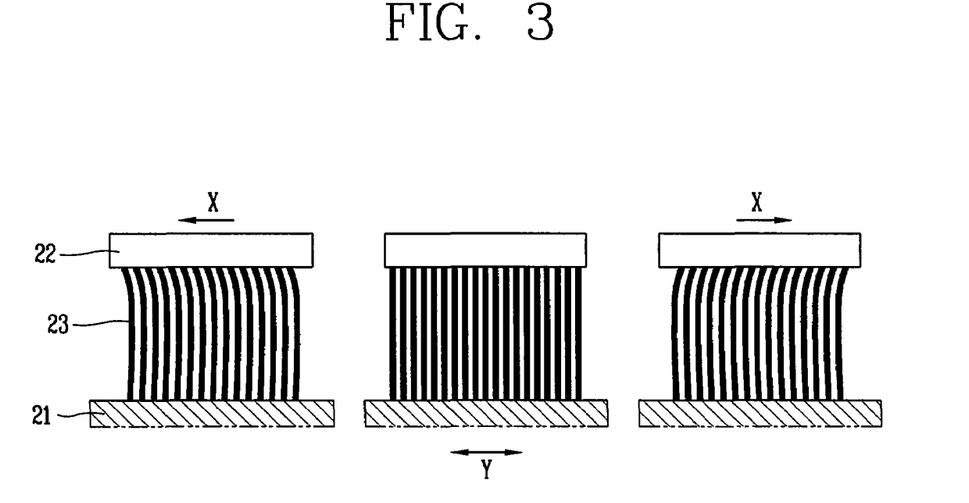
FIG. 3 is a view illustrating a basic structure of an electric power generating apparatus for a movement type equipment according to a second embodiment of the present invention (herein, X represents an amplitude of a mass part and Y represents an amplitude of the movement type equipment)

Hereinafter, an electric power generating apparatus for a movement type equipment according to a second embodiment of the present invention will be described with reference to the accompanying drawings. FIG. 3 is a view illustrating a basic structure of an electric power generating apparatus for a movement type equipment according to a second embodiment of the present invention, and illustrates the basic structure of the electric power generating apparatus where a plurality of piezoelectric beams are provided, one end of each piezoelectric beam is fixed to the movement type equipment and other end is fixed to a mass part, and also illustrates the piezoelectric beams deformed when the mass part horizontally vibrates. Herein, X represents an amplitude of the mass part and Y represents an amplitude of the movement type equipment.

Referring to FIG. 3, the electric power generating apparatus for the movement type equipment according to the second embodiment of the present invention includes a plurality of piezoelectric beams 23 having ends fixed to a movement type equipment 21, a mass part 22 for connecting other ends of the piezoelectric beams 23 with one another, and a rectifier unit (not shown) for rectifying and storing electric energy generated due to deformation of the piezoelectric beams 23.

Since a single beam has a limit in generating energy, sufficient energy may not be obtained. Therefore, in order to solve such a problem, the electric power generating apparatus for the movement type equipment according to the second embodiment of the present invention includes the plurality of piezoelectric beams 23 disposed in a row on the movement type equipment 21. In this case, since the voltage generated from parallel disposition has displacement of the same phase, the magnitude of generated electric energy increases in proportion to the number of the piezoelectric beams 23.

Figure 4:
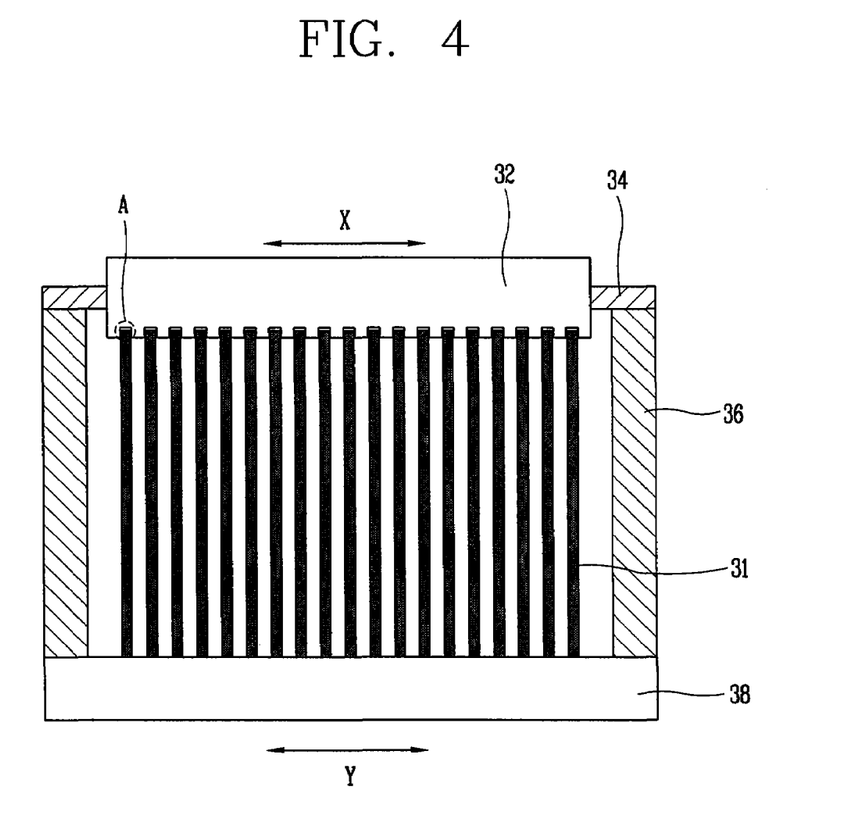
FIG. 4 is a view illustrating a basic structure of an electric power generating apparatus for a movement type equipment according to a third embodiment of the present invention.
Figure 5:
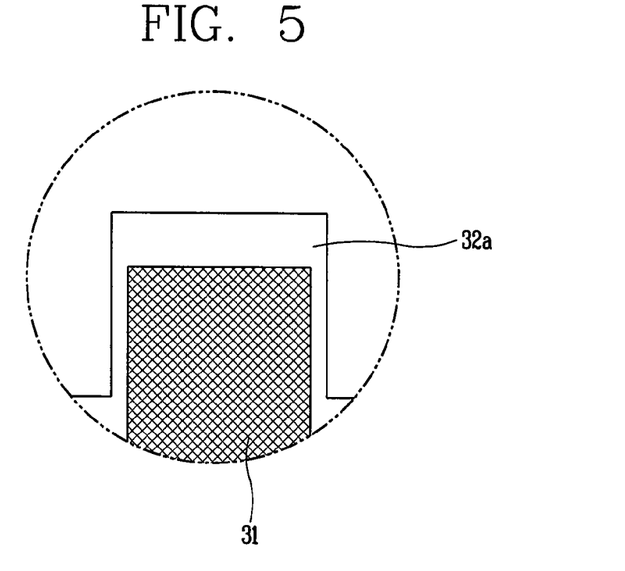
FIG. 5 is an enlarged view of a part "A" of FIG. 4.
Figure 6:
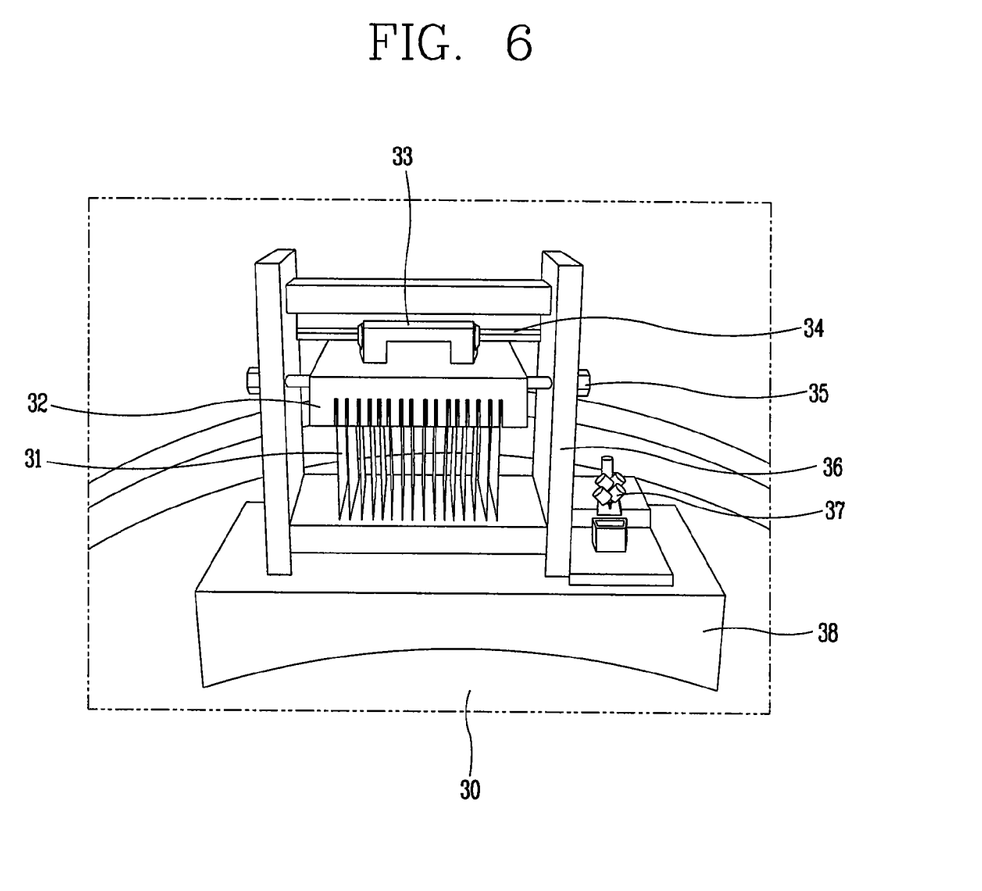
FIG. 6 is a view illustrating an entire structure of the electric power generating apparatus for the movement type equipment of FIG. 4.

Hereinafter, an electric power generating apparatus for a movement type equipment according to a third embodiment of the present invention will be descried with reference to the accompanying drawings. FIG. 4 is a view illustrating a basic structure of an electric power generating apparatus for a movement type equipment according to a third embodiment of the present invention. FIG. 5 is an enlarged view of a part "A" of FIG. 4. FIG. 6 is a view illustrating an entire structure of the electric power generating apparatus for the movement type equipment of FIG. 4.

Referring to FIGS. 4 to 6, the electric power generating apparatus for the movement type equipment according to the third embodiment of the present invention includes a base 38, a plurality of piezoelectric beams 31, a mass part 32, a guide unit, a support member 36, a stopper 35, and a rectifier unit 37. The base 38 is mounted on a movement type equipment 30 and the piezoelectric beams 31 are mounted in a row on the base 38. A plurality of mounting grooves 32a are formed in the mass part 32 to connect other ends of the piezoelectric beams 31 to one another, and other ends of the piezoelectric beams 31 are inserted into the mounting grooves 32a. The guide unit guides the mass part 32 so as to slide in an X direction perpendicular to the piezoelectric beams 31. The support member 36 supports the guide unit and the stopper 35 limits the movement range of the mass part 32. The rectifier unit 37 rectifies and stores electric energy generated due to deformation of the piezoelectric beams 31.

When a mass is increased too much, a beam is bent due to gravity or is deformed more than critical amount of deformation to create a crack, and thus the piezoelectric beams 31 cannot function any more. Also, in the case of rotation, influence of centrifugal force is so great that a mass is inclined only to a radius direction, and slight vibration is smaller than centrifugal force and thus cannot induce movement of a mass. However, the electric power generating apparatus for the movement type equipment according to the third embodiment of the present invention solves the above-mentioned problems and proposes a manufacturable structure.

That is, when a base has a low vibration frequency, or more deformation is created in the definite space to draw energy, load of an end of the beam should be increased to adjust a resonance frequency. Thus, the plurality of mounting grooves 32a are formed in the mass part 32, and the piezoelectric beams 23 are inserted into the mounting grooves 32a, and thereby, the mass part 32 is supported by the support member 36 and the mass part 32 may horizontally vibrate in a length direction of the guide unit.

In order to minimize friction between the mass part 32 and the guide unit, the guide unit includes a bearing 33 mounted on an upper surface of the mass part 32 and a guide rod 34 inserted into the bearing 33 to guide the mass part 32 to move in the X direction.

The stopper 35 includes a screw and is inserted in a screw hole (now shown) penetrating both sides of the support member 36 to limit the movement range of the mass part 32 in the X direction. That is, the movement range of the mass part 32 in the X direction is decreased by tightening the screw. On the contrary, the movement range of the mass part 32 in the X direction is increased by loosening the screw. Alternatively, the stopper 35 may be formed of urethane or rubber and fixed to the inner side of the support member 36. In this case, the movement range of the mass part 32 is determined by thickness of urethane or rubber.

When the above-described electric power generating apparatus for the movement type equipment is mounted on something that moves, it converts external force into vibration in a direction perpendicular to the piezoelectric beam to deform a piezoelectric material, and uses electric energy generated due to the deformation. Therefore, the electric power generating apparatus may be applied to a wireless sensor, an intelligent RFID system, a standalone sensor, TPMS sensor, etc. Also, the electric power generating apparatus does not require change of a battery, and thus may be variously utilized as a power source of a ubiquitous movement type equipment.

Figure 7:
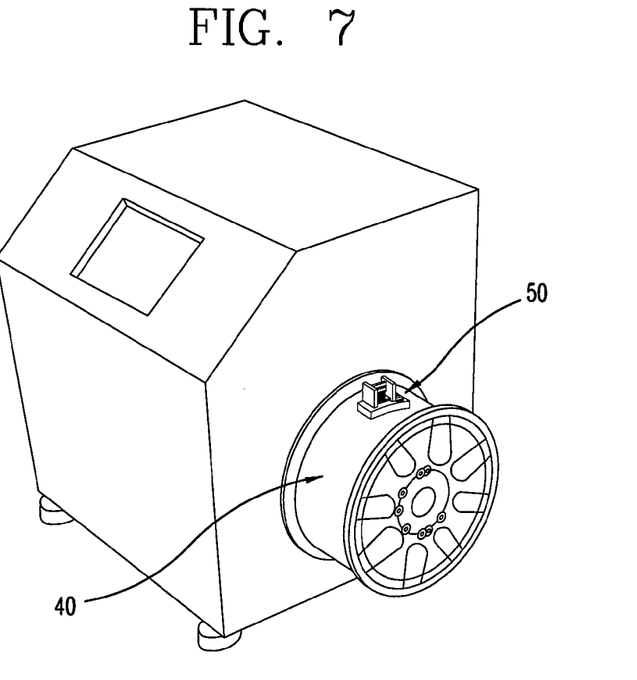
FIGS. 7 and 8 are views of a self-generation system having an electric power generating apparatus for a movement type equipment according to a fourth embodiment of the present invention.
Figure 8:
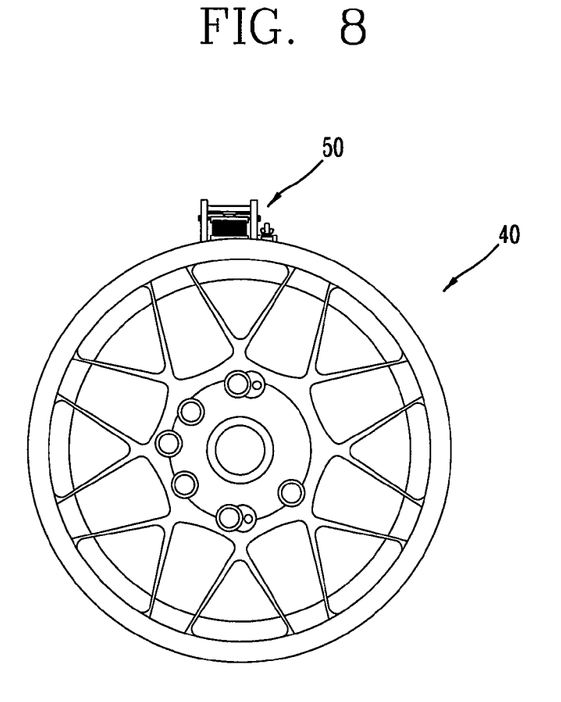
Figure 9:
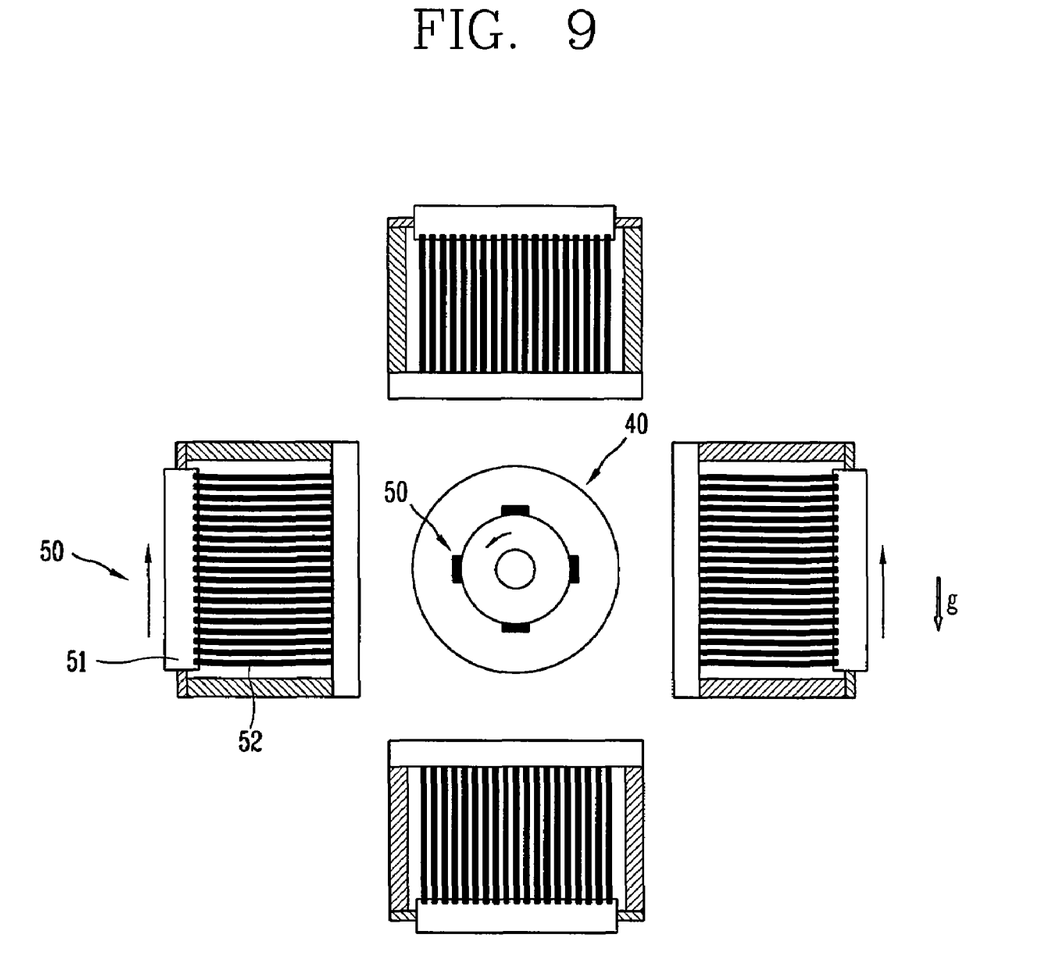
FIG. 9 is a view of a self-generation system where four electric power generating apparatuses for a movement type equipment are mounted on four sides of an aluminum wheel of FIG. 8.

Hereinafter, a self-generation system according to a fourth embodiment of the present invention will be described with reference to the accompanying drawings. FIGS. 7 and 8 are views of a self-generation system having an electric power generating apparatus for a movement type equipment according to a fourth embodiment of the present invention. FIG. 9 is a view of a self-generation system where four electric power generating apparatuses for a movement type equipment are mounted on four sides of an aluminum wheel of FIG. 8.

Referring to FIGS. 7 to 9, the self-generation system according to the fourth embodiment of the present invention includes a movement type equipment 40 and an electric power generating apparatus 50 for a movement type equipment. The electric power generating apparatus 50 includes a plurality of piezoelectric beams 52 having ends fixed to the movement type equipment 40 and other ends with a mass 51, and a rectifier unit (not shown) rectifying and storing electric energy generated due to deformation of the piezoelectric beams 52.

Here, the movement type equipment 40 includes an aluminum wheel of a tire, and the electric power generating apparatus 50 is mounted on an upper surface of the aluminum wheel.

Referring to FIG. 9, in order to prevent rotation imbalance caused by high speed rotation of the aluminum wheel, the four electric power generating apparatuses 50 are symmetrically disposed on up and down surfaces and right and left surfaces of the aluminum wheel, respectively.

Figure 10:
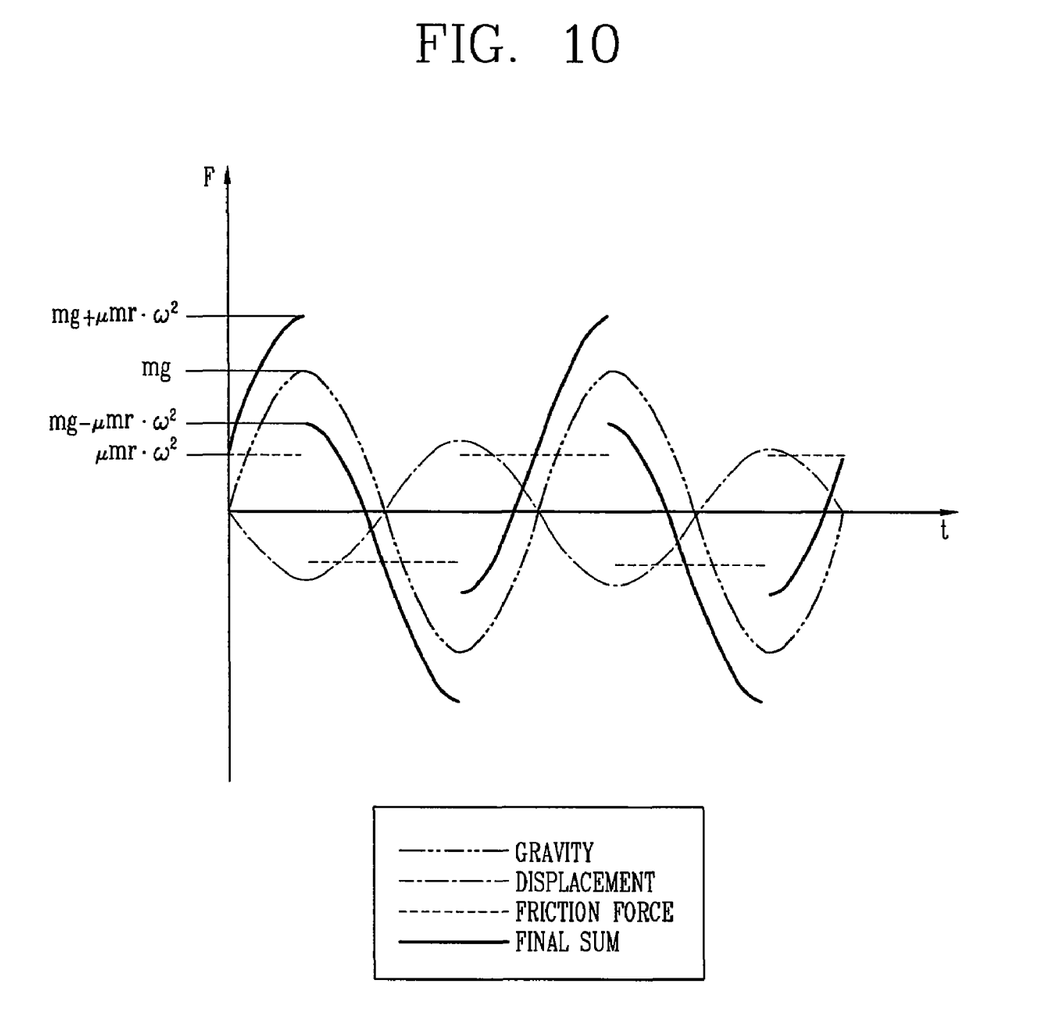
FIG. 10 is a graph illustrating displacement of an end of a piezoelectric beam of FIG. 9 on the elapsed time by calculating gravity-friction force-centrifugal force.

FIG. 10 is a graph illustrating displacement of an end of a piezoelectric beam of FIG. 9 on the elapsed time by calculating gravity-friction force-centrifugal force. Referring to FIG.

10, as the aluminum wheel rotates, the piezoelectric beams 52 are periodically deformed on the elapsed time.

Figure 11:
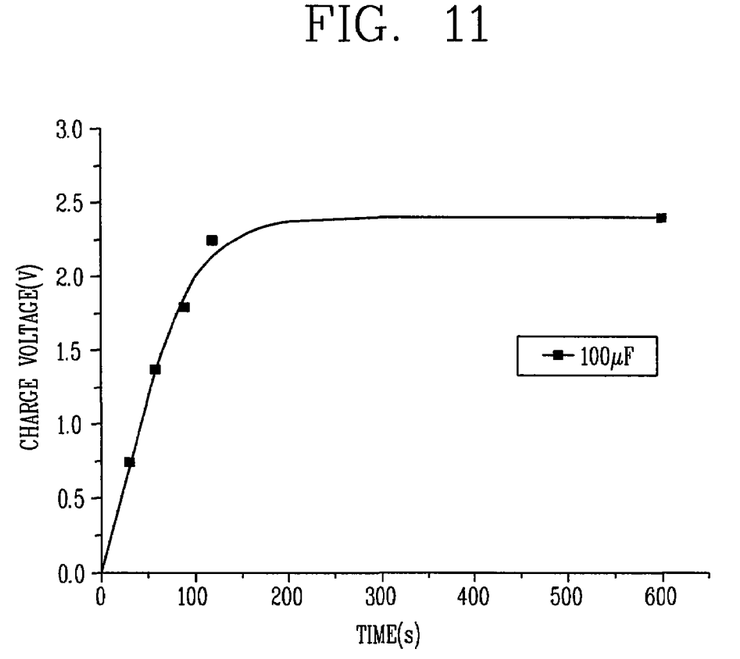
FIG. 11 is a graph illustrating a storage voltage on the elapsed time when the piezoelectric beam of FIG. 9 is deformed.
Figure 12:
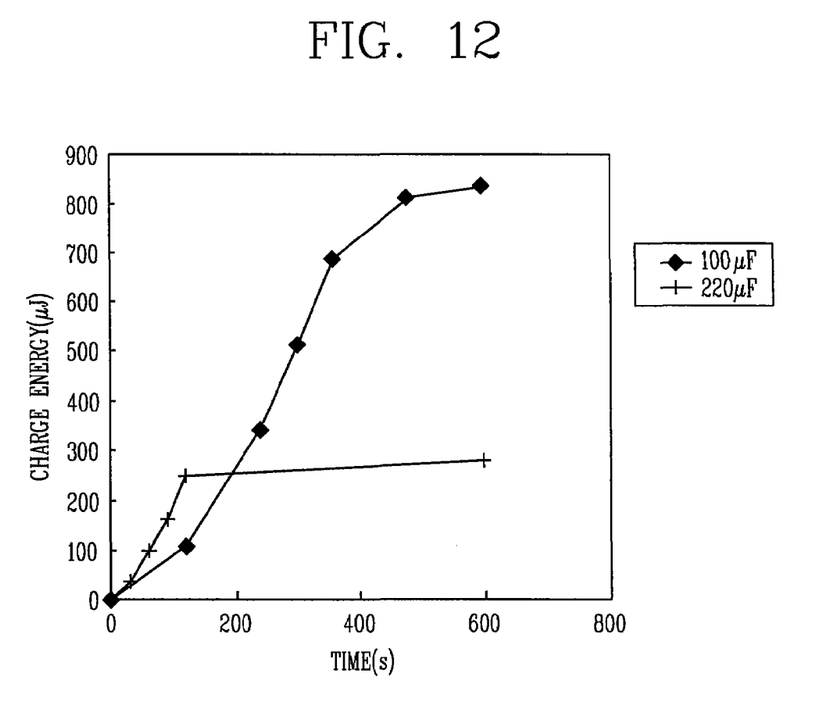
FIG. 12 is a graph illustrating charge energy on the elapsed time and by a charge capacity.

FIG. 11 is a graph illustrating a storage voltage on the elapsed time when the piezoelectric beam of FIG. 9 is deformed, and FIG. 12 is a graph illustrating charge energy on the elapsed time and by a charge capacity.

Referring to FIG. 11, as time elapses, a voltage of 2.3 V is charged in a storage battery having a capacity of 100 μF in the rectifier unit due to deformation of the piezoelectric beams 52 (refer to FIG. 9). Also, referring to FIG. 12, as time elapses, charge energy of 260 μJ is charged in a storage battery having a capacity of 100 μF in the rectifier unit, and charge energy of 850 μJ is charged in a storage battery having a capacity of 200 μF in the rectifier unit, due to deformation of the piezoelectric beams 52. Therefore, it is shown that the electric power generating apparatus according to the present invention can practically generate electric power.

The above-described self-generation system can provide electric power necessary for a TPMS that measures temperature or pressure in a tire and transfer the information wirelessly using rotation of the tire.

As described above, an electric power generating apparatus for a movement type equipment according to embodiments of the present invention has the following effects. Since external movement is converted into vibration perpendicular to an electric beam using elasticity of the electric beam and load applied to an end of the beam, high energy conversion efficiency can be obtained in inducing continuous vibration to the piezoelectric beam. Also, resonance effect can be expected from proper design of the piezoelectric beam and proper choice of a mass part. Using resonance, strong vibration can be obtained by repeating periodical and weak force. In the case of a piezoelectric material of which an axial direction stress is in proportion to a generated voltage, greater an axial direction deformation is, more advantageous it is, and an amount of energy generated using resonance is very great. Also, high energy conversion efficiency can be obtained even in a constant speed drive by offsetting centrifugal force structurally, and using resonance. In addition, the present invention has originality in maximizing energy conversion efficiency using rotation and resonance.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An electric power generating apparatus for a movement type equipment comprising:
   a base mounted on a movement type equipment;
   a piezoelectric beam having an end mounted on the base;
   a mass unit mounted on another end of the piezoelectric beam; and
   a rectifier unit for rectifying and storing electric energy generated resulting from deformation of the piezoelectric beam;
   a guide unit for guiding the mass part to slide; and
   a support member for supporting the guide unit, wherein the guide unit comprises:
   a bearing mounted on a surface of the mass unit; and
   a guide rod inserted into the bearing to guide the unit part to move in a direction perpendicular to the piezoelectric beam.

2. The apparatus of claim 1, wherein ends of a plurality of piezoelectric beams are disposed in a row on the base, and the mass part connects other ends of the piezoelectric beams with one another.

3. The apparatus of claim 2, wherein other ends of the piezoelectric beams are inserted into a plurality of mounting grooves formed in the mass part.

4. The apparatus of claim 1, further comprising a stopper for limiting the movement range of the mass part.

5. A self-generation system comprising:
   a movement type equipment; and
   an electric power generating apparatus for a movement type equipment including a piezoelectric beam having an end fixed to a movement type equipment and other end with a mass unit and a rectifier unit for rectifying and storing electric energy generated due to deformation of the piezoelectric beam;
   wherein the electric power generating apparatus comprises;
   a bearing mounted on a surface of the mass unit; and
   a guide rod inserted into the bearing to guide the mass unit to move in a direction perpendicular to the piezoelectric beam.

6. The self-generation system of claim 5, wherein the movement type equipment includes an aluminum wheel of a tire, and the electric power generating apparatus is mounted in the aluminum wheel of the tire.

7. The self-generation system of claim 6, wherein the two electric power generating apparatuses are symmetrically disposed on up and down surfaces of the aluminum wheel, respectively, or the four electric power generating apparatuses are symmetrically disposed on up and down surfaces and right and left surfaces of the aluminum wheel, respectively.

8. An electric power generating apparatus for a movement type equipment comprising:
   a base mounted on a movement type equipment;
   a piezoelectric beam having an end mounted on the base;
   a mass unit mounted on another end of the piezoelectric beam; and
   a rectifier unit for rectifying and storing electric energy generated resulting from deformation of the piezoelectric beam;
   a guide unit for guiding the mass part to slide;
   a support member for supporting the guide unit; and
   a friction reduction member configured to reduce friction and energy loss generated with slide movement of the mass part.

9. The electric power generating apparatus of claim 8, wherein the friction reduction member is engaged with the guide unit.

* * * * *